United States Patent
Iwafuchi

(10) Patent No.: US 9,379,154 B2
(45) Date of Patent: Jun. 28, 2016

(54) SOLID-STATE IMAGE PICKUP APPARATUS

(75) Inventor: Toshiaki Iwafuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 81 days.

(21) Appl. No.: 13/545,589

(22) Filed: Jul. 10, 2012

(65) Prior Publication Data

US 2013/0026591 A1    Jan. 31, 2013

(30) Foreign Application Priority Data

Jul. 27, 2011   (JP) ................. 2011-163935

(51) Int. Cl.
*H01L 31/0232* (2014.01)
*H01L 27/146* (2006.01)

(52) U.S. Cl.
CPC .... *H01L 27/14618* (2013.01); *H01L 27/14621* (2013.01); *H01L 27/14627* (2013.01); *H01L 2224/16* (2013.01)

(58) Field of Classification Search
None
See application file for complete search history.

(56) References Cited

U.S. PATENT DOCUMENTS

| | | | |
|---|---|---|---|
| 2002/0135854 A1* | 9/2002 | Takeuchi et al. | 359/290 |
| 2003/0128291 A1* | 7/2003 | Harazono et al. | 348/374 |
| 2005/0035421 A1* | 2/2005 | Kayanuma et al. | 257/432 |
| 2008/0316620 A1* | 12/2008 | Huang | 359/819 |
| 2010/0002107 A1* | 1/2010 | Harazono | 348/294 |
| 2010/0032781 A1* | 2/2010 | Ryu | 257/432 |
| 2012/0211852 A1* | 8/2012 | Iwafuchi et al. | 257/435 |

FOREIGN PATENT DOCUMENTS

JP    2006-222249    8/2006

* cited by examiner

*Primary Examiner* — Evan Pert
*Assistant Examiner* — Shaka White
(74) *Attorney, Agent, or Firm* — Hazuki International, LLC

(57) ABSTRACT

A solid-state image pickup apparatus including a substrate and a solid-state image pickup device. The substrate includes an opening portion. The solid-state image pickup device is mounted as a flip chip on a lower surface of the substrate on a circumference of the opening portion and receives and photo-electrically converts light that is taken in by a lens set on an upper surface of the substrate and enters from the opening portion. The circumference of the opening portion of the substrate is thinner than other portions of the substrate.

5 Claims, 6 Drawing Sheets

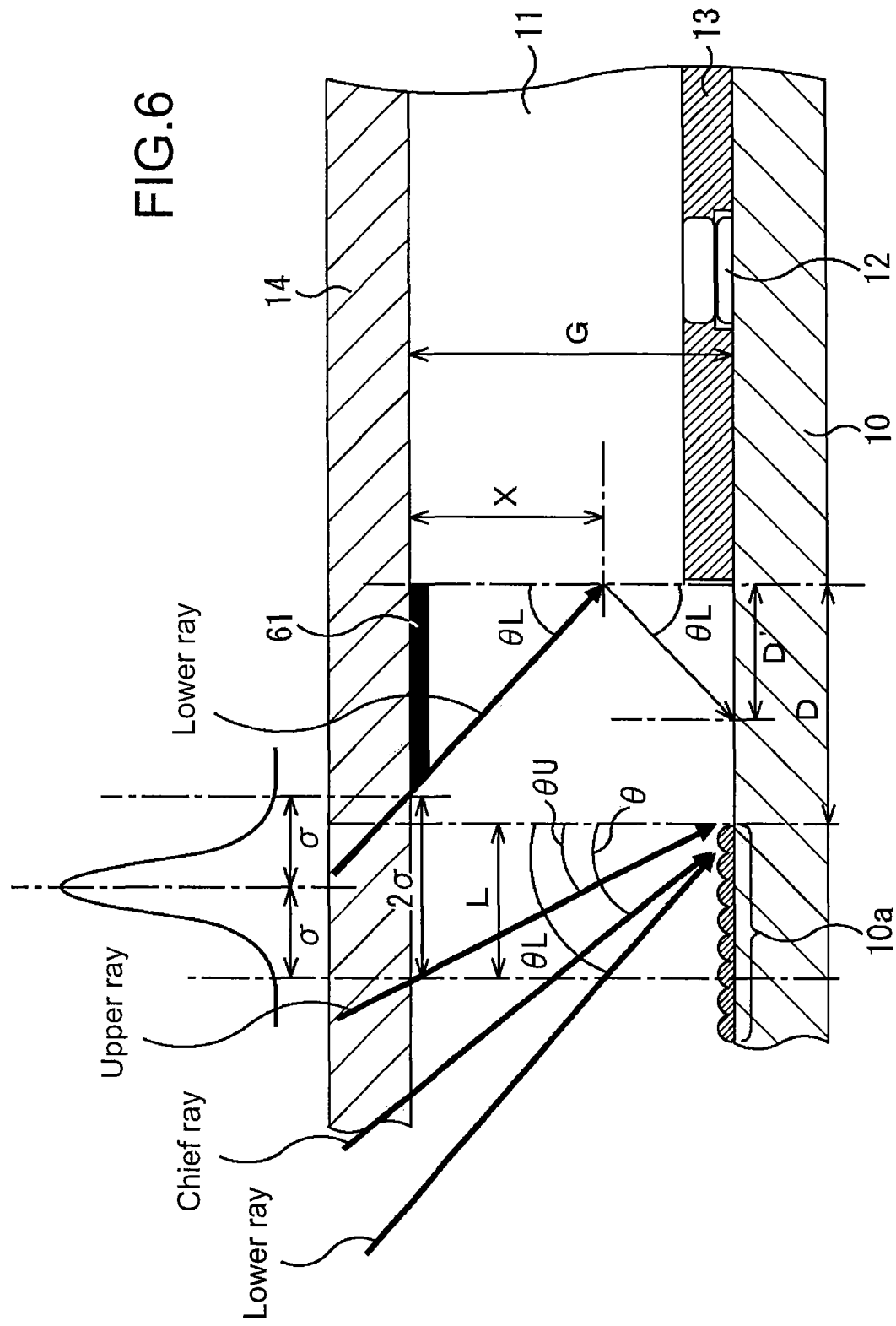

SOLID-STATE IMAGE PICKUP APPARATUS

BACKGROUND

The present disclosure relates to a solid-state image pickup apparatus, more particularly, to a solid-state image pickup apparatus capable of suppressing a generation of flares and ghosts.

In recent years, in an image sensor in a solid-state image pickup apparatus, chip shrink is apt to progress by an introduction of an advanced process as in other semiconductor chips. Therefore, when designing a solid-state image pickup apparatus in which an image sensor and a substrate are connected by wire bonding, for example, providing a bonding pad within an effective diameter of a lens in the image sensor is being considered.

In such a case, however, there has been a fear that light that has entered from the lens may be reflected by a wire (gold wire) surface connected to the bonding pad and enter a light-receiving surface on the image sensor, to thus generate flares and ghosts.

As a countermeasure, a solid-state image pickup apparatus that includes a light shield member for shielding light that enters the periphery of a bonding pad provided on an image sensor out of light from a lens is being proposed (see, for example, Japanese Patent Application Laid-open No. 2006-222249).

With this structure, light that has entered from the lens is reflected by a gold wire surface connected to the bonding pad so that flares and ghosts generated by such reflected light entering the light-receiving surface on the image sensor can be suppressed.

SUMMARY

Incidentally, in recent years, a solid-state image pickup apparatus having a flip-chip structure to make it thinner is known.

FIG. 1 is a diagram showing a structure of a solid-state image pickup apparatus having a flip-chip structure in the related art.

In the solid-state image pickup apparatus shown in FIG. 1, a CMOS image sensor 10 (hereinafter, simply referred to as image sensor 10) is electrically connected to a substrate 11 including an opening portion via bumps 12. The connection portions between the image sensor 10 and the substrate 11 by the bumps 12 are sealed by an underfill (UF) 13 formed of an epoxy resin or the like. Moreover, to the opening portion of the substrate 11, a seal member 14 for protecting an upper portion of a light-receiving surface 10a of the image sensor 10 is bonded by a UV-curable bonding member. It should be noted that the bonding member may be a thermoset type. The seal member 14 is formed of a transparent material that transmits light, and incident light from a lens (not shown) indicated by bold arrows in the figure enters the light-receiving surface 10a of the image sensor 10 via the seal member 14.

In the solid-state image pickup apparatus shown in FIG. 1 having the flip-chip structure, the light-receiving surface 10a and an edge surface of the opening portion of the substrate 11 are relatively close to each other. Therefore, there is a fear that light reflected by the edge surface of the opening portion of the substrate 11 out of the incident light that has entered via the seal member 14 may enter the light-receiving surface 10a to thus induce a generation of flares and ghosts.

By positioning the light-receiving surface 10a and the edge surface of the opening portion of the substrate 11 such that reflected light does not enter the light-receiving surface 10a, however, the chip size of the image sensor 10 becomes large.

The present disclosure has been made in view of the circumstances as described above and aims at suppressing the generation of flares and ghosts.

According to an embodiment of the present disclosure, there is provided a solid-state image pickup apparatus including: a substrate including an opening portion; and a solid-state image pickup device that is mounted as a flip chip on a lower surface of the substrate on a circumference of the opening portion and receives and photo-electrically converts light that is taken in by a lens set on an upper surface of the substrate and enters from the opening portion, the circumference of the opening portion of the substrate being thinner than other portions of the substrate.

The circumference of the opening portion of the substrate may have a single-layer structure, and the other portions of the substrate may have a multi-layer structure.

The opening portion of the substrate may have a seal member fixed thereto by a resin, the seal member being provided for protecting a light-receiving surface of the solid-state image pickup device, and the resin may be mixed with one of a black carbon filler and pigment.

The solid-state image pickup apparatus may further include a light shield member that is provided on one of a surface of the seal member on the lens side and a surface thereof on the solid-state image pickup device side and shields a part of light that enters the solid-state image pickup device from the lens, and an angle of an edge surface of the light shield member with respect to an optical axis direction of the lens may be larger than an incident angle of light that enters an edge portion of the light shield member.

The angle of the edge surface of the light shield member with respect to the optical axis direction of the lens may be larger than a largest incident angle of the light that enters the edge portion of the light shield member.

An edge surface of the opening portion does not need to intersect a virtual extension surface of the edge surface of the light shield member.

In the embodiment of the present disclosure, in the solid-state image pickup apparatus including the substrate including the opening portion and the solid-state image pickup device that is mounted as a flip chip on the lower surface of the substrate on a circumference of the opening portion and receives and photo-electrically converts light that is taken in by the lens set on the upper surface of the substrate and enters from the opening portion, the circumference of the opening portion of the substrate is thinner than other portions of the substrate.

According to the embodiment of the present disclosure, the generation of flares and ghosts can be suppressed.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 6 is a diagram for explaining a position of a light shield member and a distance between an end portion of a light-receiving surface and an edge surface of the opening portion of the substrate.

DETAILED DESCRIPTION OF EMBODIMENTS

Hereinafter, an embodiment of the present disclosure will be described with reference to the drawings.

[Structural Example of Solid-State Image Pickup Apparatus]

Figure 2:
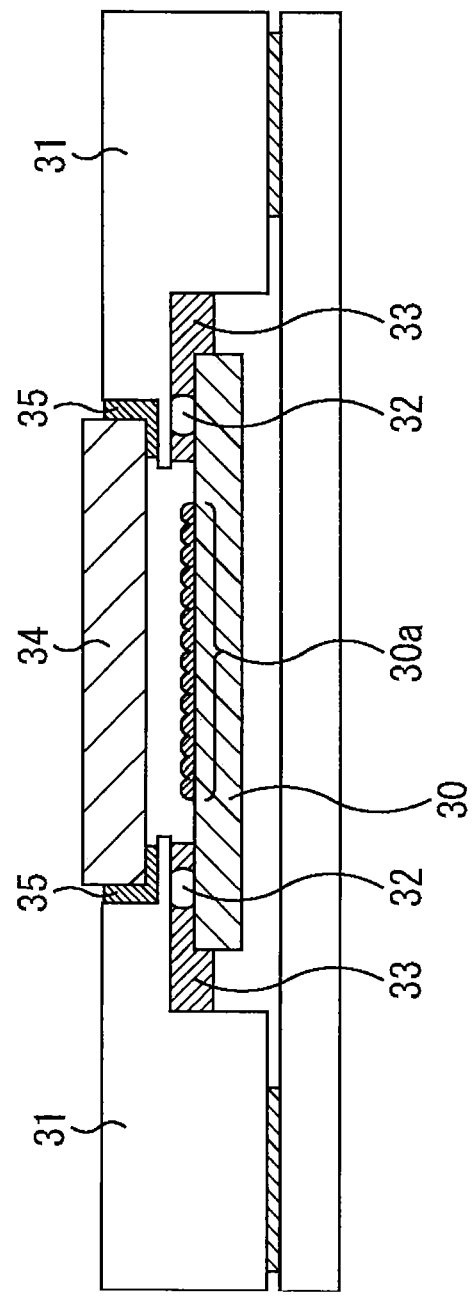
FIG. 2 is a diagram showing a structural example of a solid-state image pickup apparatus having a flip-chip structure, to which the present disclosure is applied.

FIG. 2 is a diagram showing a structural example of an embodiment of a solid-state image pickup apparatus to which the present disclosure is applied.

The solid-state image pickup apparatus shown in FIG. 2 is constituted of a CMOS (Complementary Metal Oxide Semiconductor) image sensor 30, a substrate 31, bumps 32, an underfill (UF) 33, a seal member 34, and a reinforcement resin 35.

The CMOS image sensor 30 (hereinafter, simply referred to as image sensor 30) includes a light-receiving surface 30a on which unit pixels (hereinafter, also simply referred to as pixels) including a photo-electric conversion device are arranged 2-dimensionally in a matrix and detects, as a physical amount, a charge amount corresponding to a light amount that has entered the light-receiving surface 30a in a pixel unit.

The substrate 31 is structured as, for example, a rigid flexible substrate and includes an opening portion. On a lower surface around the opening portion, the CMOS image sensor 30 is mounted as a flip chip, and the substrate 31 is electrically connected to the CMOS image sensor 30 via the bumps 32. A lens (not shown) is set on an upper surface of the substrate 31, and light taken in by the lens enters the light-receiving surface 30a of the image sensor 30 from the opening portion of the substrate 31.

Figure 3:
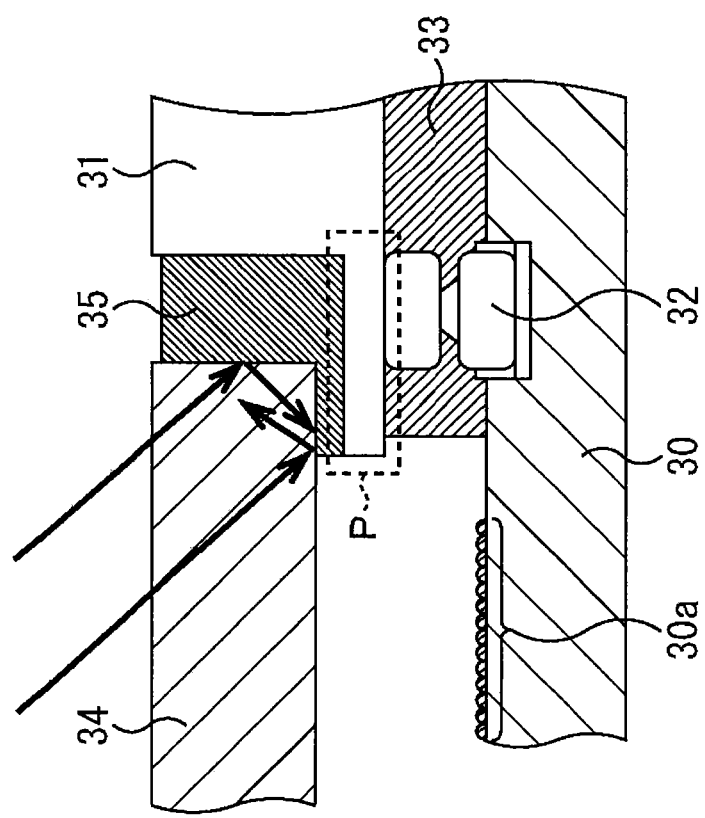
FIG. 3 is a diagram for explaining a reflection at an opening portion of a substrate in the solid-state image pickup apparatus to which the present disclosure is applied.

In the substrate 31, the thickness of the circumference of the opening portion is smaller than that of other portions of the substrate 31. Specifically, a cross-sectional surface of the circumference of the opening portion of the substrate 31 has an L shape as shown in FIG. 3, and a circumference portion P of the opening portion of the substrate 31 has a single-layer (rigid layer) structure while other portions of the substrate 31 has a multilayer (rigid layer and flexible layer) structure. In the substrate 31 shown in FIG. 3, a pad (electrodes) and wiring connected to the bumps 32 are formed on a layer including the circumference portion P of the opening portion.

The UF 33 is formed of an epoxy resin or the like and seals a connection portion between the image sensor 30 and the substrate 31 by the bumps 32.

The seal member 34 is formed of a transparent material that transmits light, such as glass and a resin film, and functions as a seal member for protecting an upper portion of the light-receiving surface 30a of the image sensor 30. An IRCF (Infrared Ray Cut Filter) as an optical filter including an infrared absorption material may be attached to an upper or lower surface of the seal member 34. Moreover, the seal member 34 itself may be an IRCF that is formed of glass, a resin film, or the like and has a function as a seal member and a function of absorbing infrared rays. The seal member 34 is fixed to the single-layer substrate of the opening portion of the substrate 31 by the UV-curable reinforcement resin 35 mixed with a black carbon filler, pigment, or the like. It should be noted that the reinforcement resin 35 may be a thermoset resin.

With the structure described above, since the circumference of the opening portion of the substrate 31 is formed to be thin, a reflection of incident light at an edge surface of the opening portion of the substrate 31 can be lessened, and a generation of flares and ghosts due to reflected light from the edge surface of the opening portion of the substrate 31 can be suppressed.

Further, while a part of incident light from the lens (not shown) indicated by bold arrows is reflected by the reinforcement resin 35 as shown in FIG. 3, reflected light that enters the light-receiving surface 30a is lessened owing to the cross section of the circumference of the opening portion of the substrate 31, the shape of the reinforcement resin 35, and the black carbon filler, pigment, or the like mixed with the reinforcement resin 35.

Therefore, the light-receiving surface 30a can be set close to the edge surface of the opening portion of the substrate 31, and since an area of the opening portion of the substrate 31 can be reduced, the chip size of the image sensor 30 can also be reduced. As a result, a cost per chip can be cut.

Moreover, since the light-receiving surface 30a can be set close to the edge surface of the opening portion of the substrate 31 in the image sensor 30, a scale of a peripheral circuit of the image sensor 30 can be made small, and a process generation of a semiconductor chip can be advanced. As a result, an image sensor complying with low power consumption and an increase in an operation speed can be provided.

Furthermore, since the chip size of the image sensor 30 can be reduced, a size of a camera module equipped with the image sensor 30 can also be reduced, and thus the present disclosure is applicable to a camera-equipped cellular phone and the like that requires miniaturization in particular.

[Other Structure Examples of Solid-State Image Pickup Apparatus]

Figure 4:
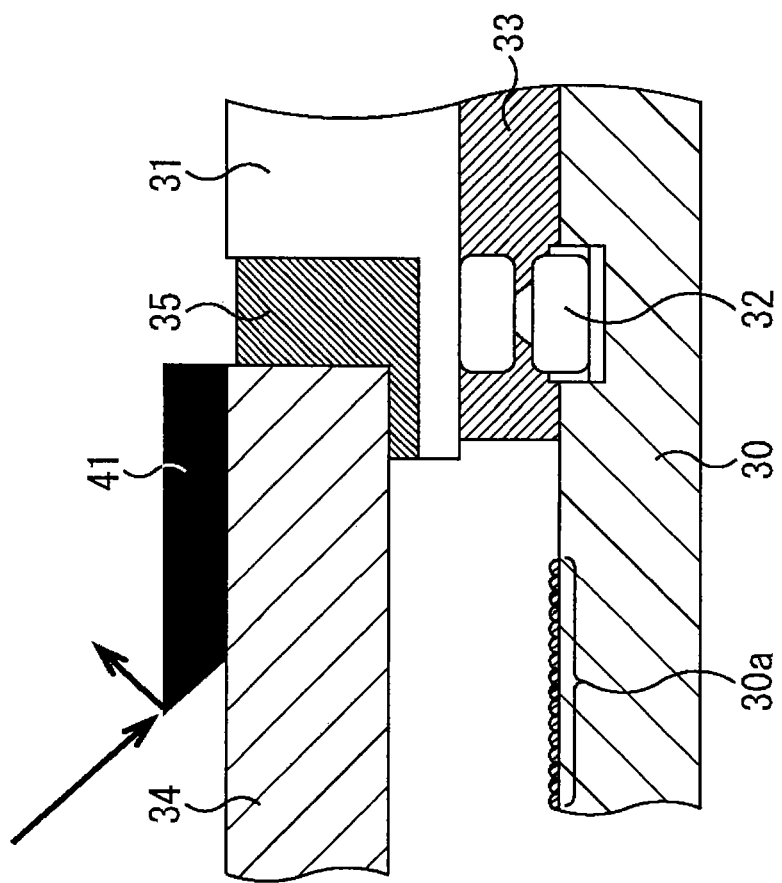
FIG. 4 is a diagram showing another structural example of the solid-state image pickup apparatus to which the present disclosure is applied.

FIG. 4 is a diagram showing another structural example of the solid-state image pickup apparatus having the flip-chip structure, to which the present disclosure is applied. It should be noted that in the solid-state image pickup apparatus shown in FIG. 4, portions corresponding to those of the solid-state image pickup apparatus shown in FIG. 2 are denoted by the same symbols.

In FIG. 4, a light shield member 41 is constituted of a black-colored film having a predetermined thickness and includes an opening portion for transmitting incident light that enters the light-receiving surface 30a of the image sensor 30 from the lens (not shown). The light shield member 41 is provided on an optical path between the lens and the image sensor 30 and attached to a lens-side surface of the seal member 34.

Most of the incident light from the lens enters the light-receiving surface 30a of the image sensor 30 from the opening portion of the light shield member 41, but incident light that enters the reinforcement resin 35 and the edge surface of the opening portion of the substrate 31 out of the incident light from the lens is shielded by the light shield member 41.

Further, by forming an angle between the edge surface of the light shield member 41 and the optical axis direction of the lens such that incident light having a largest incident angle out of the incident light that enters the light-receiving surface 30a of the image sensor 30 transmits the edge portion of the opening portion of the light shield member 41 in FIG. 4, the incident light is not reflected by the edge surface of the opening portion of the light shield member 41. In other words, the angle formed between the edge surface of the light shield member 41 and the optical axis of the lens (hereinafter, referred to as edge surface angle) is larger than the incident angle of incident light that enters the edge portion of the opening portion of the light shield member 41. It should be noted that the edge surface angle of the edge surface of the opening portion of the light shield member 41 can be formed by molding a film as the light shield member 41.

Furthermore, the width of the light shield member 41 (length in lateral direction in figure) is set such that the edge surface of the opening portion of the substrate 31 does not intersect a virtual extension surface of the edge surface of the opening portion of the light shield member 41. In other words, incident light that has transmitted through the edge portion of the opening portion of the light shield member 41 is not reflected by the edge surface of the opening portion of the substrate 31.

With the structure described above, incident light is not reflected by the reinforcement resin 35 and the edge surface of the opening portion of the substrate 31, and incident light is also not reflected by the edge surface of the opening portion of the light shield member 41. Therefore, the generation of flares and ghosts due to reflected light from the reinforcement resin 35, the edge surface of the opening portion of the substrate 31, and the edge surface of the opening portion of the light shield member 41 can be suppressed.

Further, since the amount of reflected light that enters the light-receiving surface 30a can be additionally reduced, the light-receiving surface 30a and the edge surface of the opening portion of the substrate 31 can be positioned closer to each other, and thus the area of the opening portion of the substrate 31 can be additionally reduced. Therefore, the chip size of the image sensor 30 can be additionally reduced.

Although the light shield member 41 is attached to the lens-side surface of the seal member 34 in the descriptions above, the light shield member 41 may be attached to the surface of the seal member 34 on the other side of the lens-side surface (surface on image sensor 30 side).

[Another Structural Example of Solid-State Image Pickup Apparatus]

Figure 5:
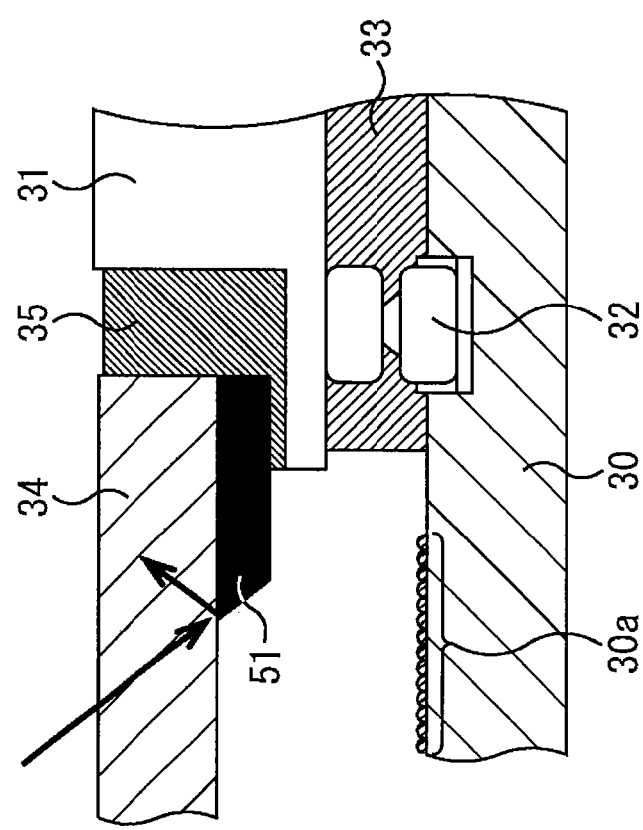
FIG. 5 is a diagram showing another structural example of the solid-state image pickup apparatus to which the present disclosure is applied.

FIG. 5 is a diagram showing another structural example of the solid-state image pickup apparatus having the flip-chip structure, to which the present disclosure is applied. It should be noted that in the solid-state image pickup apparatus shown in FIG. 5, portions corresponding to those of the solid-state image pickup apparatus shown in FIG. 4 are denoted by the same symbols.

Specifically, in the solid-state image pickup apparatus shown in FIG. 5, a light shield member 51 is attached to the image sensor 30-side surface of the seal member 34.

It should be noted that while the light shield member is formed of a black-colored film in the solid-state image pickup apparatus shown in FIG. 4, the light shield member 51 may be formed by printing a printing material on the seal member 34 in the solid-state image pickup apparatus shown in FIG. 5. Examples of the printing material include an epoxy resin, an acrylic resin, and an epoxy-acrylic resin that are colored in black by a carbon filler, pigment, or the like, and the printing material includes a UV-curable property or a thermoset property. Alternatively, the printing material may be a resin including a normal-temperature-curable property. A screen printing method or an inkjet printing method is used as a printing method for such a printing material.

It should be noted that when the light shield member 51 is a fluid-type printing material, the edge surface angle of the light shield member 51 is obtained as a contact angle of the printing material that is determined based on a wetting property of the seal member 34. It should be noted that the edge surface angle may be obtained based on an overlapping degree of the printing material printed a plurality of times.

Alternatively, the light shield member 51 may be formed by depositing a thin film on the seal member 34 by vapor deposition. In this case, the light shield member 51 is formed by performing side etching in patterning an opening portion with respect to the deposited thin film.

With the structure described above, incident light is not reflected by the reinforcement resin 35 and the edge surface of the opening portion of the substrate 31, and incident light is also not reflected by the edge surface of the opening portion of the light shield member 51. Therefore, the generation of flares and ghosts due to reflected light from the reinforcement resin 35, the edge surface of the opening portion of the substrate 31, and the edge surface of the opening portion of the light shield member 51 can be suppressed.

Further, since the amount of reflected light that enters the light-receiving surface 30a can be additionally reduced, the light-receiving surface 30a and the edge surface of the opening portion of the substrate 31 can be positioned closer to each other, and thus the area of the opening portion of the substrate 31 can be additionally reduced. Therefore, the chip size of the image sensor 30 can be additionally reduced.

[Position of Light Shield Member and Distance Between End Portion of Light-Receiving Surface and Edge Surface of Opening Portion of Substrate]

Figure 1:
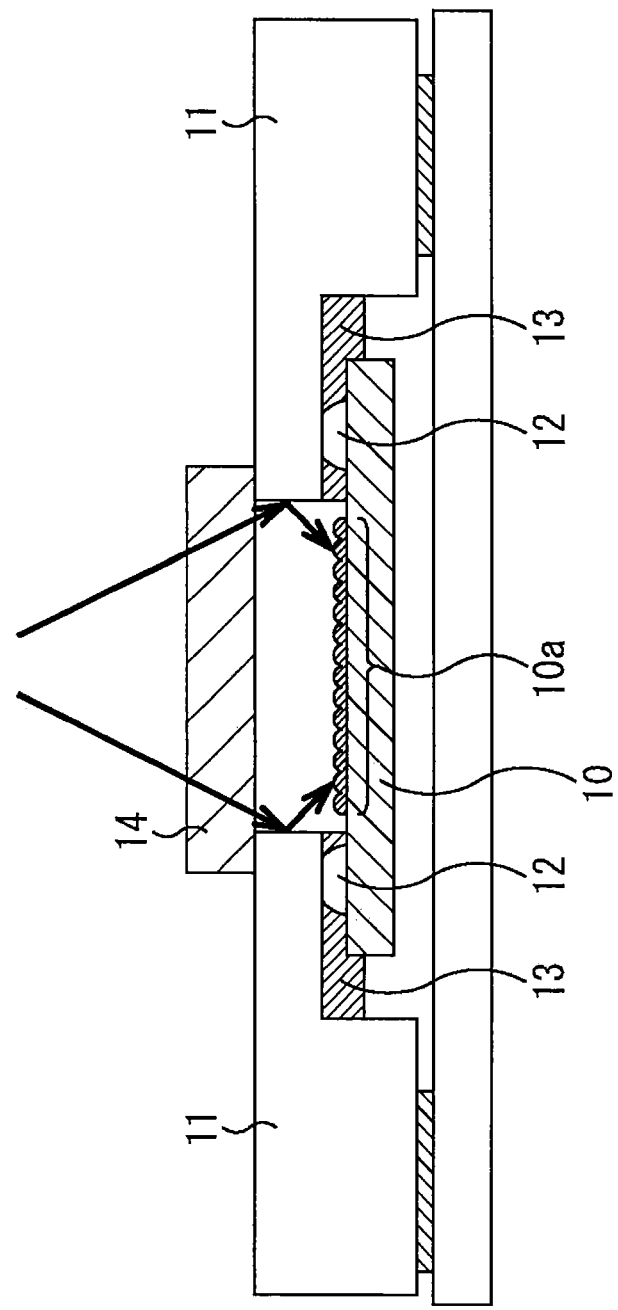
FIG. 1 is a diagram showing a structural example of a solid-state image pickup apparatus of the related art having a flip-chip structure.

Here, referring to FIG. 6, a position of the light shield member with respect to the image sensor and a distance between an end portion of the light-receiving surface and the edge surface of the opening portion of the substrate will be described. It should be noted that the descriptions below will be given on the position of the light shield member with respect to the image sensor and the distance between the end portion of the light-receiving surface and the edge surface of the opening portion of the substrate in a case where the light shield member is attached to the image sensor 10-side surface of the seal member 14 in the solid-state image pickup apparatus shown in FIG. 1.

The position of the light shield member 61 with respect to the image sensor 10 contains predetermined variances, but the variances are suppressed within a certain range. The curve shown in FIG. 6 is a distribution curve indicating variances of the position of the edge portion (edge surface) of the light shield member 61. Specifically, a peak position of the distribution curve of FIG. 6 indicates a designed position of the edge surface of the light shield member 61, and the actual position of the edge surface of the light shield member 61 contains a maximum error o from the designed position.

When a chief ray from the lens enters the light-receiving surface 10a of the image sensor 10 at a certain incident angle (CRA: Chief Ray Angle), an upper ray and a lower ray corresponding to the chief ray also enter at respective incident angles.

In FIG. 6, the upper ray that corresponds to the chief ray and enters the end portion of the light-receiving surface 10a is not blocked by the light shield member 61, and the chief ray and the upper and lower rays corresponding to the chief ray enter the light-receiving surface 10a without omission.

Further, in FIG. 6, the lower ray that has passed without being blocked by the light shield member 61 does not enter the end portion of the light-receiving surface 10a even when reflected by the edge surface of the opening portion of the substrate 11.

In other words, the position of the light shield member 61 with respect to the image sensor 10 is a position at which the chief ray and the upper and lower rays corresponding to the chief ray enter the light-receiving surface 10a without omission at the edge portion of the opening portion of the light shield member 61 and reflected light of the lower ray does not enter the light-receiving surface 10a.

Here, when the distance between the edge portion of the opening portion of the light shield member 61 and the edge portion of the light-receiving surface 10a is represented by D and a distance between the edge portion of the opening portion of the light shield member 61 and the position where the reflected light of the lower ray enters the image sensor 10 is represented by D', the reflected light of the lower ray does not enter the light-receiving surface 10a as long as the following Expression (1) is satisfied.

$$D > D' \quad (1)$$

Here, when the distance between the seal member 14 and the surface of the image sensor 10 (gap length) is represented by G, the incident angle of the lower ray is represented by θL, and the distance between the seal member 14 and the reflection position of the lower ray at the edge surface of the opening portion of the substrate 11 is represented by X, D' is expressed by the following Expression (2).

$$D' = (G-X)\tan\theta L \quad (2)$$

Moreover, when a distance between a position deviated from the designed position by an amount corresponding to the maximum error σ toward the center of the opening portion at the edge surface of the light shield member 61 and a position vertical to the end portion of the light-receiving surface 10a is represented by L, the following Expression (3) is established.

$$L + D = 2\sigma + X\tan\theta L \quad (3)$$

Therefore, the distance X can be expressed by the following Expression (4).

$$X = (L+D-2\sigma)/\tan\theta L \quad (4)$$

Substituting the distance X expressed by Expression (4) into Expression (2), Expression (1) can be expressed by the following Expression (5).

$$D > (G\tan\theta L - L + 2\sigma)/2 \quad (5)$$

Here, when the incident angle of the upper ray is represented by θU, L=G tan θU is established. Therefore, Expression (5) above can be expressed by the following Expression (6).

$$D > \{G(\tan\theta L - \tan\theta U) + 2\sigma\}/2 \quad (6)$$

In other words, by designing the solid-state image pickup apparatus so that it satisfies Expression (6) above, the lower ray that has passes without being blocked by the light shield member 61 does not enter the end portion of the light-receiving surface 10a even when reflected by the edge surface of the opening portion of the substrate 11, and thus the generation of flares and ghosts due to reflected light from the edge surface of the opening portion of the substrate 11 can be suppressed.

Further, according to Expression (6), the distance D between the edge portion of the opening portion of the light shield member 61 and the end portion of the light-receiving surface 10a can be made smaller as the gap length G becomes smaller. In other words, by thinning the substrate 11, the distance D between the edge portion of the opening portion of the light shield member 61 and the end portion of the light-receiving surface 10a can be made small, and eventually the area of the opening portion of the substrate 11 can be additionally reduced.

It should be noted that the present disclosure is not limited to the above embodiment and can be variously modified without departing from the gist of the present disclosure.

The present disclosure may also take the following structures.

(1) A solid-state image pickup apparatus, including:
a substrate including an opening portion; and
a solid-state image pickup device that is mounted as a flip chip on a lower surface of the substrate on a circumference of the opening portion and receives and photo-electrically converts light that is taken in by a lens set on an upper surface of the substrate and enters from the opening portion,
the circumference of the opening portion of the substrate being thinner than other portions of the substrate.

(2) The solid-state image pickup apparatus according to (1),
in which the circumference of the opening portion of the substrate has a single-layer structure, and the other portions of the substrate have a multi-layer structure.

(3) The solid-state image pickup apparatus according to (1) or (2),
in which the opening portion of the substrate has a seal member fixed thereto by a resin, the seal member being provided for protecting a light-receiving surface of the solid-state image pickup device, and
in which the resin is mixed with one of a black carbon filler and pigment.

(4) The solid-state image pickup apparatus according to (3), further including
a light shield member that is provided on one of a surface of the seal member on the lens side and a surface thereof on the solid-state image pickup device side and shields a part of light that enters the solid-state image pickup device from the lens,
in which an angle of an edge surface of the light shield member with respect to an optical axis direction of the lens is larger than an incident angle of light that enters an edge portion of the light shield member.

(5) The solid-state image pickup apparatus according to (4),
in which the angle of the edge surface of the light shield member with respect to the optical axis direction of the lens is larger than a largest incident angle of the light that enters the edge portion of the light shield member.

(6) The solid-state image pickup apparatus according to (4) or (5),
in which an edge surface of the opening portion does not intersect a virtual extension surface of the edge surface of the light shield member.

The present disclosure contains subject matter related to that disclosed in Japanese Priority Patent Application JP 2011-163935 filed in the Japan Patent Office on Jul. 27, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus, comprising:
a monolithic substrate including an opening portion;
a solid-state image pickup device that is mounted as a flip chip on a lower surface of the monolithic substrate on a circumference of the opening portion, the solid-state image pickup device being configured to receive and photo-electrically convert light that enters from the opening portion and a lens;
a seal member affixed to the opening portion of the monolithic substrate; and
a light shield member that is provided on one of a surface of the seal member opposite the solid-state image pickup device and a surface closest to the solid-state image pickup device and that shields a part of light that enters the solid-state image pickup device through the lens, wherein the circumference of the opening portion of the monolithic substrate being thinner than any other portions of the monolithic substrate in a direction perpendicular to an upper surface of the solid-state image pickup device, a cross-sectional surface of the circumference of the opening portion of the monolithic substrate has an L shape, and an angle of an edge surface of the light shield member with respect to an axis perpendicular to an upper surface of the solid-state image pickup device is larger than an incident angle of light that enters an edge portion of the light shield member.

2. The solid-state image pickup apparatus according to claim 1, wherein the seal member is affixed to the opening portion of the monolithic substrate by a resin, the seal member being configured to protect a light-receiving surface of the solid-state image pickup device, and wherein the resin is mixed with one of a black carbon filler and pigment.

3. The solid-state image pickup apparatus according to claim 1, wherein the angle of the edge surface of the light shield member with respect to the axis perpendicular to the solid-state image pickup device is larger than a largest incident angle of the light that enters the edge portion of the light shield member.

4. The solid-state image pickup apparatus according to claim 3, wherein an edge surface of the opening portion does not intersect a virtual extension surface of the edge surface of the light shield member.

5. The solid-state image pickup apparatus according to claim 1, wherein the solid-state image pickup device is a complementary metal oxide semiconductor (CMOS) device.

* * * * *